United States Patent [19]
Ueno

[11] Patent Number: 5,818,210
[45] Date of Patent: Oct. 6, 1998

[54] REFERENCE VOLTAGE GENERATING CIRCUIT

[75] Inventor: Masayuki Ueno, Chiba, Japan

[73] Assignee: Kawasaki Steel Corporation, Kobe, Japan

[21] Appl. No.: 762,983

[22] Filed: Dec. 10, 1996

[30] Foreign Application Priority Data

Dec. 15, 1995 [JP] Japan .................................. 7-327009

[51] Int. Cl.⁶ ........................................................ G05F 1/12
[52] U.S. Cl. ............................. 323/297; 365/45; 341/155
[58] Field of Search .............................. 323/297; 365/45, 365/46; 341/154, 155

[56] References Cited

U.S. PATENT DOCUMENTS

| | | | |
|---|---|---|---|
| 3,441,913 | 4/1969 | Pastoriza | 365/45 |
| 4,810,948 | 3/1989 | Takuma | 232/297 |
| 5,523,712 | 6/1996 | Miyabe et al. | 327/355 |
| 5,570,091 | 10/1996 | Noro et al. | 341/155 |
| 5,585,795 | 12/1996 | Yuasa et al. | 341/144 |

*Primary Examiner*—Stuart N. Hecker
*Attorney, Agent, or Firm*—Oliff & Berridge, PLC

[57] ABSTRACT

A reference voltage generating circuit outputs a reference voltage (used for comparison of magnitude with an analog voltage) at a plurality of levels by using a differential amplifier to amplify voltages at nodes formed by mutually adjacent resisters among a plurality of resistors comprising a ladder resistor unit which is optionally selected by a decoder and an analog switch unit.

14 Claims, 5 Drawing Sheets

5,818,210

REFERENCE VOLTAGE GENERATING CIRCUIT

BACKGROUND OF THE INVENTION

1. Field of the Invention

The present invention relates to a reference voltage generating circuit used in an analog-to-digital converter.

2. Description of the Related Art

When an analog-to-digital converter converts an inputted analog voltage to a digital value, it requires a reference voltage generating circuit that generates a reference voltage used for comparison with the input analog voltage.

FIG. 3 shows a block diagram of a successive approximation analog-to-digital converter provided with a reference voltage generating circuit proposed in Japanese Unexamined Patent Publication No. 63-138814.

The reference voltage generating circuit 31 shown in FIG. 3 generates a predetermined reference voltage, and inputs the voltage to a digital-to-analog conversion circuit 32. The digital-to-analog conversion circuit 32 divides the inputted reference voltage into a plurality of voltages, and inputs any one voltage of the separated voltages to a voltage comparator 33. The voltage comparator 33 compares the magnitude of the voltage from the digital-to-analog conversion circuit 32 and an analog voltage SA inputted from the exterior, and inputs the comparison result to a successive approximation register 34. Based on the inputted, comparison result, the successive approximation register 34 sequentially switches the voltage outputted from the digital-to-analog conversion circuit 32 in accordance with the timing outputted from a timing circuit 35. In such a manner that a digital value DA that corresponds to the level of the analog voltage SA is outputted from the successive approximation register 34.

FIG. 4 shows a circuit diagram of a successive approximation analog-to-digital converter proposed in Japanese Unexamined Patent Publication No. 5-7157.

This publication describes a detailed example of the digital-to-analog conversion circuit shown in FIG. 3.

A reference voltage $V_{REF}$ is supplied from a reference voltage generating circuit (not shown) to one end of a switch 45 shown in FIG. 4. Between the other end of the switch 45 and ground GND there is disposed a ladder resistor unit 41 consisting of resistors 41-1, 41-2, . . . 41-n which are mutually connected in series. Ends of switches 42-1, 42-2, . . . 42-n are correspondingly connected to points at which the resistors 41-1, 41-2, . . . 41-n are connected and to the ground GND. The other ends of the switches 42-1, 42-2, . . . 42-n are mutually connected to one input terminal of a comparator 43. An analog voltage $AN_{in}$ is inputted to the other input terminal of the comparator 43. The analog voltage $AN_{in}$, has a magnitude in the range between the reference voltage $V_{REF}$ and the ground GND. The output terminal of the comparator 43 is connected to a successive approximation register 44.

In this arrangement, when the switch 45 is turned on, the reference voltage is applied to the ladder resistor unit 41. The ladder resistor unit 41 consists of the resistors 41-1, 41-2, . . . 41-n, thus, n (including the ground GND) divided voltages (referred to hereinafter as "divided voltages") are generated in the ladder resistor unit 41. Among the divided voltages, any one divided voltage is selected by turning on any one switch of the switches 42-1, 42-2, . . . 42-n. The divided voltage selected is inputted to the comparator 43, in which the divided voltage and the analog voltage $AN_{in}$ are compared, and the comparison result is inputted to the successive approximation register 44. The successive approximation register 44 refers to the inputted result, and sequentially turns on any one switch of the switches 42-1, 42-2, . . . 42-n so that the divided voltage inputted to the comparator 43 approximates the level of the analog voltage $AN_{in}$. In such a manner a digital value corresponding to the level of the analog voltage $AN_{in}$ is outputted from the successive approximation register 44.

SUMMARY OF THE INVENTION

As described above, the analog-to-digital converter requires a reference voltage generating circuit for generating a reference voltage when converting an analog voltage to a digital value. Such a reference voltage generating circuit needs to generate a reference voltage having a magnitude in accordance with the analog voltage inputted to the analog-to-digital converter.

However, for example, when an analog-to-digital converter including a reference voltage generating circuit is formed in a semiconductor chip, the reference voltage generating circuit includes mainly devices which have fixed values. In this case, only a reference voltage having a predetermined magnitude is generated. As a result, the analog-to-digital converter cannot be applied to an electronic apparatus that processes an analog voltage having a range of magnitudes that exceeds the magnitude of the reference voltage. Thus causing a problem because the applicable range of the analog-to-digital converter is limited.

In addition, external components, which increase cost, are required to generate a reference voltage at a plurality of levels by connecting an external reference voltage supply to an analog-to-digital converter having no reference voltage generating circuit.

Accordingly, it is an object of the present invention to provide a low cost reference voltage generating circuit for generating a plurality of reference voltages for comparison with an analog voltage inputted to an analog-to-digital converter.

The foregoing object is achieved through the provision of a reference voltage generating circuit that includes:

a differential amplifier having first and second input terminals and one output terminal, for amplifying the voltage difference between two voltages inputted from the input terminals and for outputting the amplified voltage from the output terminal;

a ladder resistor unit having a plurality of resistors connected in series between the output terminal of the differential amplifier and ground;

a voltage generating unit connected to the first input terminal of the differential amplifier, the voltage generating unit for applying a predetermined voltage to the first input terminal; and a switching circuit unit for selectively connecting nodes between the plurality of resistors comprising the ladder resistor unit to the second input terminal of the differential amplifier.

Preferably, the differential amplifier, having two or more inputs and one or more outputs, amplifies the difference between the two inputs, and outputs the amplified difference.

One end of the ladder resistor unit does not always need to be connected to ground, but may be connected to an electric potential at a fixed level. This fixed level electric potential further may be variably controlled.

The voltage generating unit may be variably controlled, and in this case the reference voltage can be finely adjusted.

In the switching circuit unit, analog switches do not need to be disposed for all the nodes of the ladder resistor unit, but a simplified switching circuit unit can be formed by connecting the analog switches to only a plurality of optional nodes.

In addition, as part of the switching circuit unit for selectively connecting the nodes, a setting value to be decode may be directly inputted to a terminal of a decoder or a setting value may be determined by, for example, a microcomputer via a bus-line. In such a manner, various types of setting means are realized.

DESCRIPTION OF THE PREFERRED EMBODIMENTS

By referring to the attached drawings, embodiments of the present invention will be described below.

Figure 1:
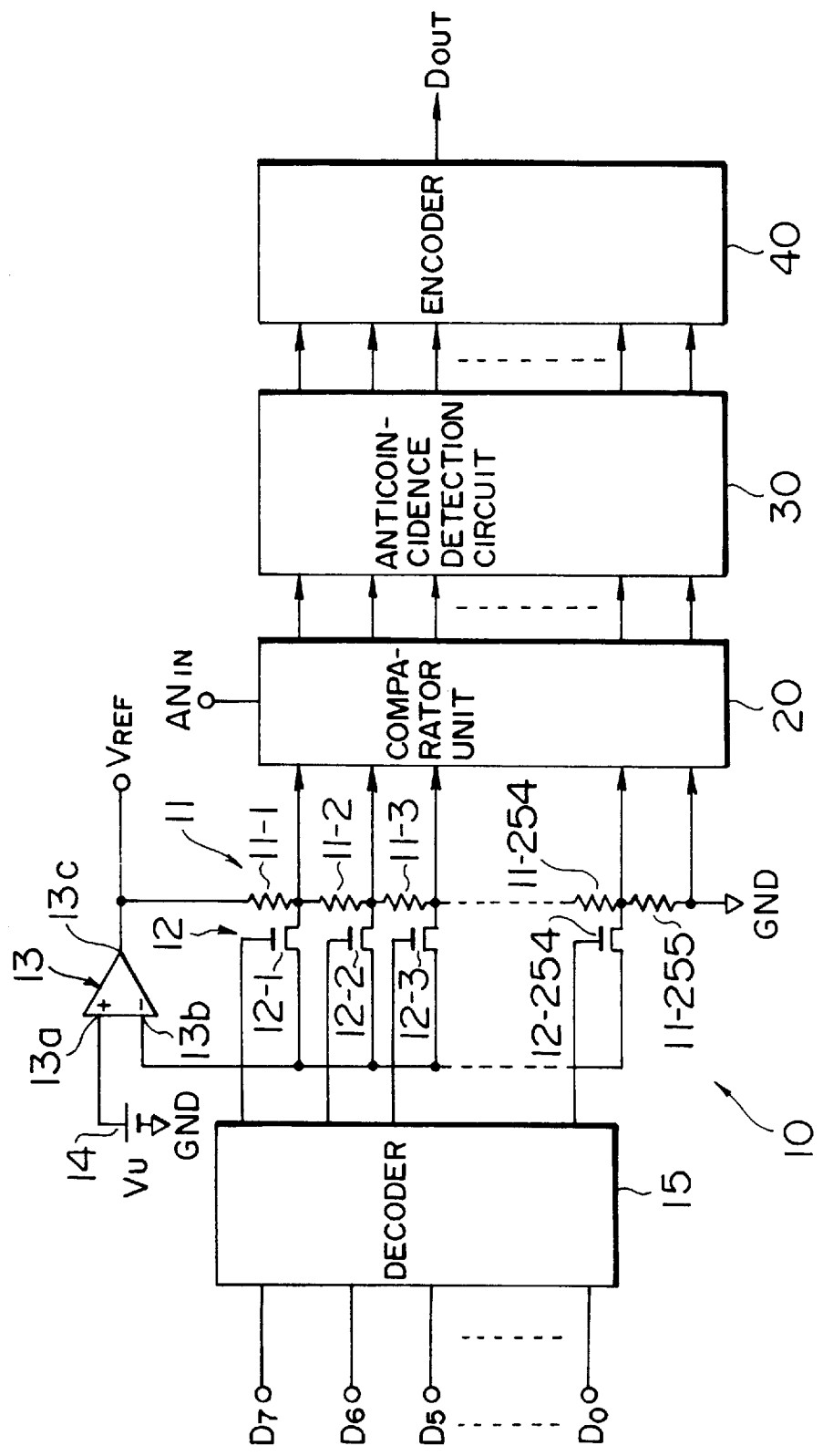
FIG. 1 is a block diagram showing a flash analog-to-digital converter having a built-in reference voltage generating circuit according to a first embodiment of the present invention.

FIG. 1 shows a block diagram of a flash analog-to-digital converter having a built-in reference voltage generating circuit according to a first embodiment of the present invention.

The reference voltage generating circuit 10 according to this embodiment, shown in FIG. 1, includes a differential amplifier 13. This differential amplifier 13 has two input terminals, a non-inverting input terminal 13a and an inverting input terminal 13b, and one output terminal 13c. The differential amplifier 13 amplifies the voltage difference between two voltages inputted to the input terminals 13a and 13b, and outputs the amplified voltage from the output terminal 13c. Between the non-inverting input terminal 13a of the differential amplifier 13 and ground, a voltage generating unit 14 for generating a predetermined voltage Vu is disposed. This voltage generating unit 14 comprises, for example, diodes. In addition, between the output terminal 13c of the differential amplifier 13 and ground, a plurality of resistors 11-1, 11-2, 11-3, . . . 11-254, 11-255 are connected in series to form a ladder resistor unit 11. These resistors 11-1, 11-2, 11-3, . . . 11-254, 11-255 each have a mutually equal resistance r. The reference voltage generating circuit 10 also includes an analog switch unit 12. This analog switch unit 12 comprises analog switches 12-1, 12-2, 12-3, . . . 12-254. Ends of the analog switches are connected to points to which the resisters 11-1, 11-2, 11-3, . . . 11-254, 11-255 are connected. The other ends are mutually connected to the inverting input terminal 13b of the differential amplifier 13. The reference voltage generating circuit 10 further includes a decoder 15 whose outputs are connected to the inputs of the respective analog switches 12-1, 12-2, 12-3, . . . 12-254. The analog switch unit 12 and the decoder 15 comprise a switching circuit unit according to the present invention. Signals D0, . . . D7 for activating any one of the analog switches 12-1, 12-2, 12-3, . . . 12-254 are inputted to the inputs of the decoder 15, and thereby nodes which comprise mutually adjacent resistors among a plurality of resisters 11-1, 11-2, 11-3, . . . 11-254, 11-255 comprising the ladder resistor unit 11 are selectively connected to the inverting input terminal 13b of the differential amplifier 13. The points at which the resistors 11-1, 11-2, 11-3, . . . 11-254, 11-255 of the above-described reference voltage generating circuit 10 are respectively connected to a plurality of comparators comprising a comparator unit 20 to which an analog voltage $AN_{in}$ is inputted. The comparator unit 20 is connected to an anticoincidence detection circuit 30 which is connected to an encoder 40.

By referring to FIG. 2, the operating principles of the reference voltage generating circuit 10 will be described.

Figure 2:
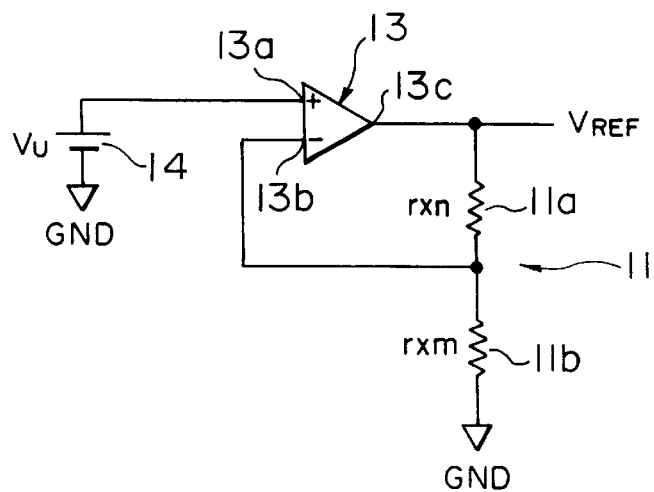
FIG. 2 is an explanatory circuit diagram showing the operating principles of the reference voltage generating circuit 10 shown in FIG. 1.
Figure 3:
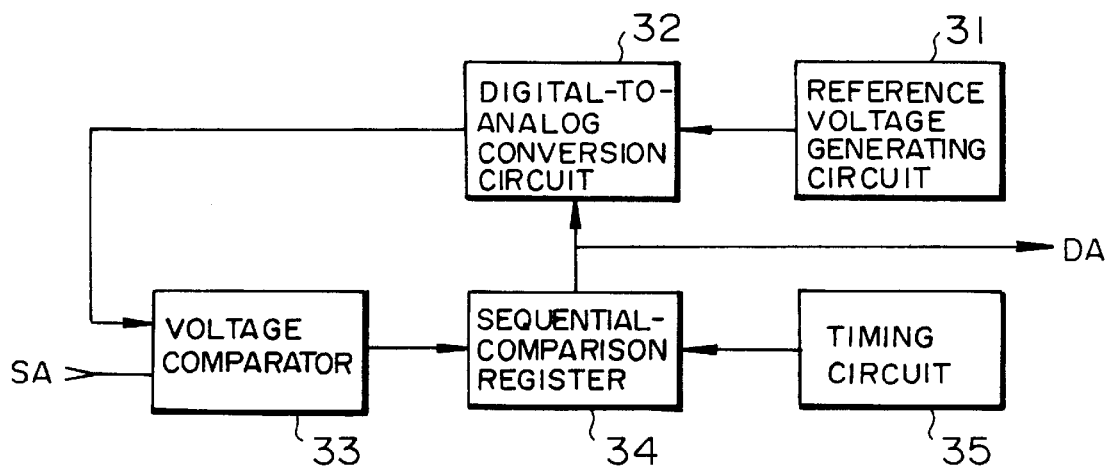
FIG. 3 is a block diagram showing a successive approximation analog-to-digital converter proposed in Japanese Unexamined Patent Publication No. 63-138814.
Figure 4:
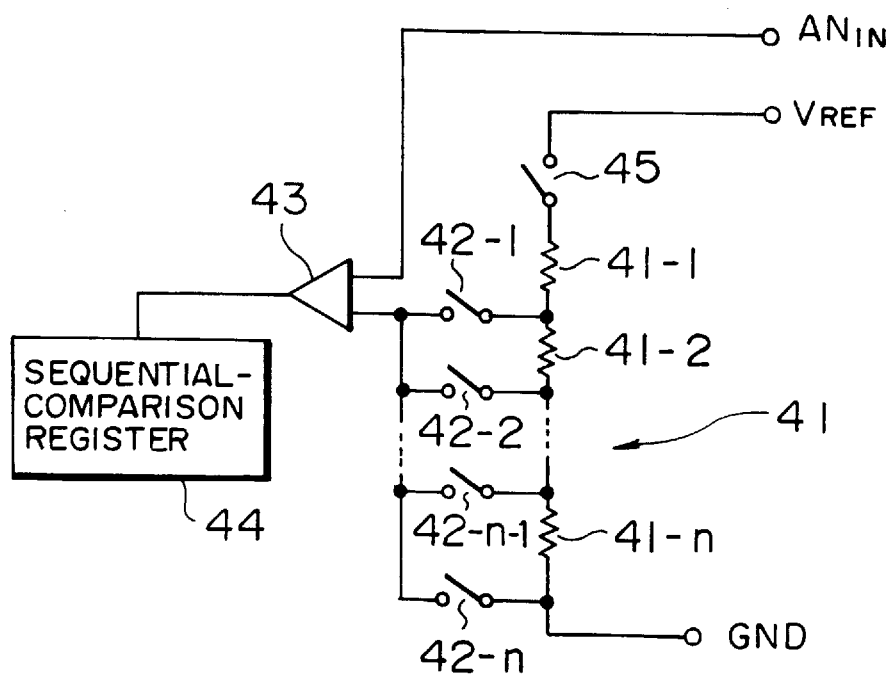
FIG. 4 is a circuit diagram showing a successive approximation analog-to-digital converter proposed in Japanese Unexamined Patent Publication No. 5-7157.

FIG. 2 shows an explanatory circuit diagram of the reference voltage generating circuit 10 shown in FIG. 1.

As described above, the predetermined voltage Vu is supplied from the constant-voltage generating unit 14 to the non-inverting input terminal 13a of the differential amplifier 13 shown in FIG. 2. When signals D0, . . . D7 are inputted to the decoder 15 shown in FIG. 1, the n-th switch 12-n of the analog switch unit 12 is activated and the ladder resistor unit 11 separates into a first resistor unit 11a comprising n resistors 11-1, . . . 11-n and a second resistor unit 11b comprising m resistors 11-n+1, . . . 11-255. The point to which the first resistor unit 11a and the second resistor unit 11b are connected is connected to the inverting input terminal 13b of the differential amplifier 13. The resistors 11-1, 11-2, 11-3, . . . 11-254, 11-255 each have a mutually equal resistance r [Ω]. The first resistor unit 11a which comprises n resistors 11-1, . . . 11-n has a resistance expressed by r×n [Ω], while the second resistor unit 11b which comprises m resistors 11-n+1, . . . 11-255 has a resistance expressed by r×m [Ω]. Therefore, a voltage at the node in which the first resistor unit 11a and the second resistor unit 11b are connected, in other words, a voltage divided in the ratio of r×n [Ω] and r×m [Ω] is inputted to the inverting input terminal 13b of the differential amplifier 13. Since the predetermined voltage Vu is inputted to the non-inverting input terminal 13a, the differential amplifier 13 amplifies the voltage difference between the two voltages and outputs a reference voltage $V_{REF}$. The reference voltage $V_{REF}$ outputted from the differential amplifier 13 is expressed by the following equation:

$$V_{REF} = (1 + (r \times n)/(r \times m))Vu$$
$$= (1 + n/m)Vu$$

The ratio of r×n [Ω] and r×m [Ω] can be optionally determined by a combination of signals D0, . . . D7 inputted to the decoder 15. In accordance with the determined ratio, the level of the reference voltage $V_{REF}$ can be optionally determined.

By referring to FIG. 1 again, the description will continue. The reference voltage $V_{REF}$, corresponding to the inputted analog voltage $AN_{in}$, generated by the above-described reference voltage generating circuit 10, is applied to the ladder resistor unit 11 shown in FIG. 1. The reference voltage $V_{REF}$ is divided by the resistors 11-1, 11-2, 11-3, ... 11-254, 11-255 of the ladder resistor unit 11. The divided voltages are inputted to the comparator unit 20. The comparator unit 20 compares the level of the inputted voltages with the level of the analog voltage $AN_{in}$, and inputs the comparison results to the anticoincidence detection circuit 30. The anticoincidence detection circuit 30 detects the respective comparison results at predetermined timing, and outputs corresponding detection results to the encoder 40. Based on the detection results from the anticoincidence detection circuit 30, the encoder 40 converts them to a digital value $D_{out}$.

In accordance with the above-described reference voltage generating circuit 10 according to the embodiment, the reference voltage $V_{REF}$ is generated by amplifying the voltage difference between the voltages at the nodes formed by mutually adjacent resistors among a plurality of resistors (optionally selected by the decoder 10 and the analog switch unit 12, comprising the ladder resistor unit 11) and the predetermined voltage Vu. Consequently, a plurality of the reference voltages $V_{REF}$ can be generated.

Accordingly, an analog-to-digital converter that includes the reference voltage generating circuit 10 according to the embodiment can process an analog voltage at various levels, so that the applicable range of the analog-to-digital converter is expanded. In addition, the reference voltage can be finely controlled in accordance with the operating environment, which realizes high precision analog-to-digital conversion.

The foregoing embodiment has been described with an 8-bit reference voltage generating circuit that includes the ladder resistor unit comprising 255 resistors. However, a reference voltage generating circuit according to the present invention is not limited to the above embodiment. The reference voltage generating circuit may optionally generate a reference voltage at a plurality of levels with an arrangement for a different number of plural bits. The described reference voltage generating circuit according to the above embodiment has been built into a flash analog-to-digital converter. However, the reference voltage generating circuit of the present invention, is not limited to a flash analog-to-digital converter, but may be built into a sequential analog-to-digital converter as well as any other appropriate application.

By referring to FIG. 5, a second embodiment of the present invention will be described.

Figure 5:
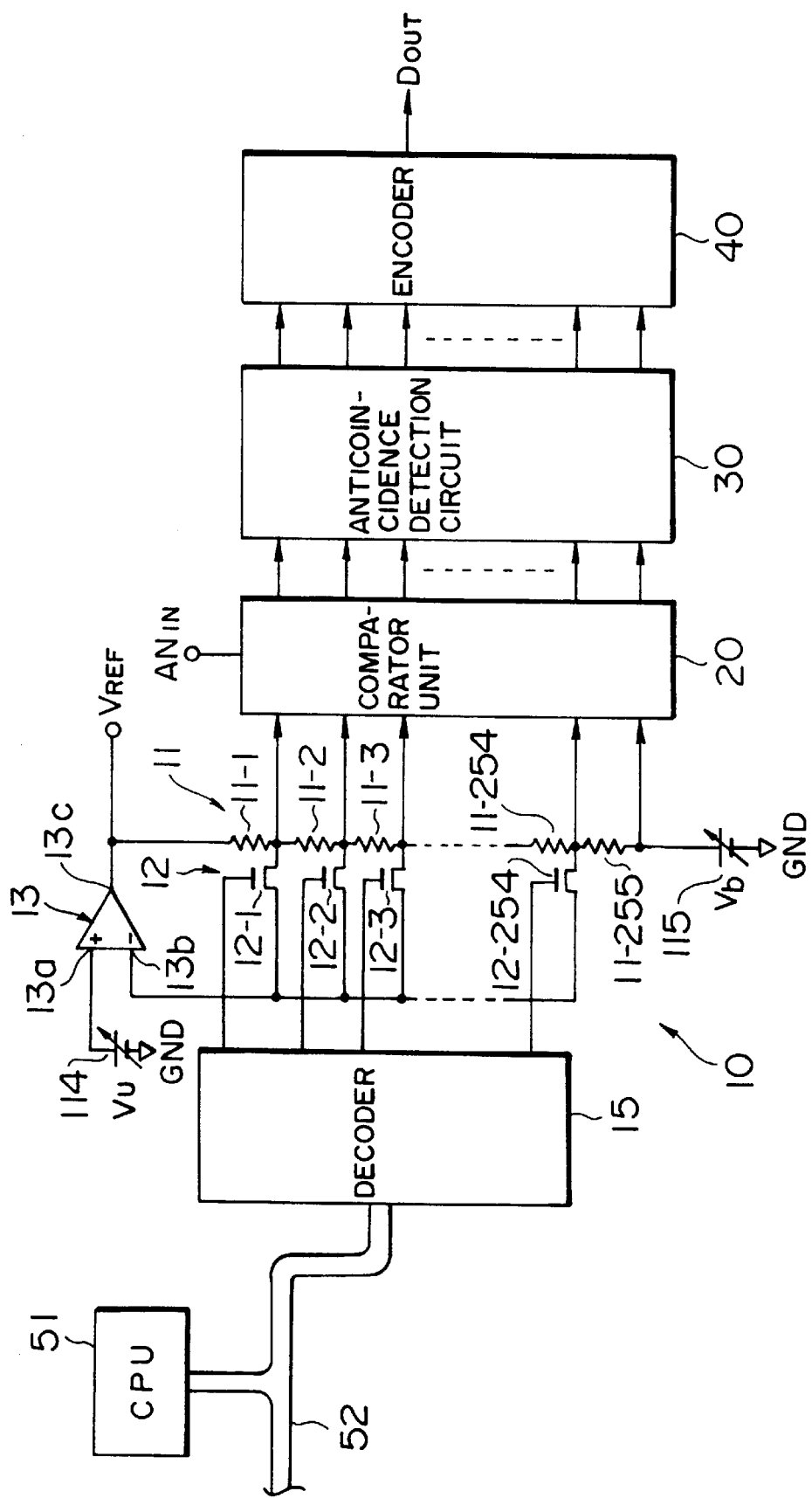
FIG. 5 is a block diagram showing a flash analog-to-digital converter having a built-in reference voltage generating circuit according to a second embodiment of the present invention.

As shown in FIG. 5, a variably controlled voltage generating unit 114 replaces a voltage generating unit (14 in FIG. 1) for applying a predetermined voltage to a first input terminal 13a of a differential amplifier 13.

This arrangement enables easy control for fine tuning of reference electric potential.

The ladder resistor unit 11 according to the first embodiment of the present invention is connected to ground, however in this embodiment the ladder resistor unit 11 is connected to another voltage (Vb) generating unit 115. This voltage (Vb) generating unit 115 may be variably controlled as shown in FIG. 5, or may have a fixed electric potential. The voltage (Vb) generating unit 115 enables simple control of the offset-span in the present invention.

In addition, as shown in FIG. 5, a value to be inputted to a decoder 15 can be determined by a central processing unit (CPU) 51 via a bus-line 52.

This arrangement provides simple dynamic determination of a reference voltage, and quick processing even when an input range frequently changes.

By referring to FIG. 6, a third embodiment of the present invention will be described.

Figure 6:
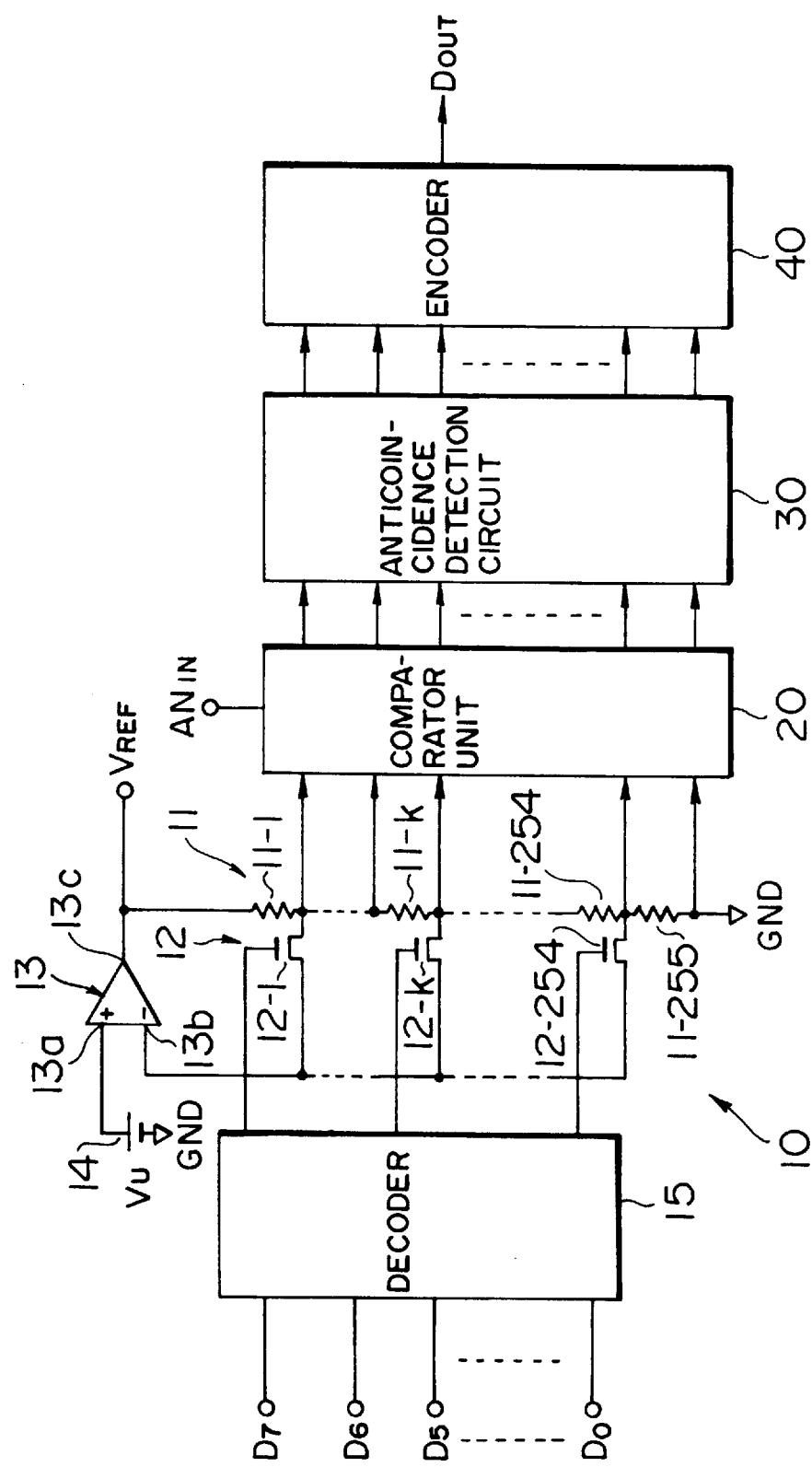
FIG. 6 is a block diagram showing a flash analog-to-digital converter having a built-in reference voltage generating circuit according to a third embodiment of the present invention.

As shown in FIG. 6, analog switches connectable to each node of a ladder resistor unit are disposed at only three nodes, the first node, the k-th node and the 254th node (where k represents any optional value of 2 to 253).

This arrangement provides a smaller switching circuit unit capable of responding only to limited reference electric potential.

In addition, with the variable voltage generating unit 114 applied to the third embodiment, fine tuning can be performed by finely adjusting the variable voltage generating unit 114. Also, the voltage (Vb) generating unit 115 shown in FIG. 5, the CPU 51 and the bus-line 52 can be applied to the third embodiment.

As set forth in the foregoing description, according to the present invention, the reference voltage used for comparison of magnitude with the analog voltage inputted to the analog-to-digital converter can be generated at a plurality of levels having greatly expanded range. Thus, the applicable range of the analog-to-digital converter having a built-in reference voltage generating circuit according to the present invention is greatly expanded.

Further, the reference voltage generating circuit according to the present invention, formed as part of the analog-to-digital converter in a semiconductor chip, does not require external components, thereby realizing a reduced cost. The mentioned improvement is apparent when comparing the present invention with the conventional art in which a reference voltage is generated by connecting an external reference voltage generating supply to an analog-to-digital converter without a built-in reference voltage generating circuit.

The present invention has been described in connection with the reference voltage generating circuit for the analog-to-digital converter, however, it need hardly be said that the reference voltage generating circuit of the present invention can be applied to a digital-to-analog converter.

While this invention has been described in conjunction with the specific embodiments outlined above, it is evident that many alterations, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

What is claimed is:

1. A reference voltage generating circuit comprising:
   a differential amplifier having first and second input terminals and one output terminal, for amplifying the voltage difference between two voltages inputted to the input terminals and outputting the amplified voltage from the output terminal;
   a ladder resistor unit comprising a plurality of resistors connected in series between the output terminal of said differential amplifier and a ground;
   a first voltage generating unit connected to the first input terminal of said differential amplifier, said voltage generating unit applying a first predetermined voltage to said first input terminal;
   a switching circuit unit for selectively connecting the second input terminal of said differential amplifier to nodes connecting mutually adjacent resistors among a plurality of resistors comprising said ladder resistor unit; and a second voltage generating unit connected between the ladder resistor unit and the ground.

2. A reference voltage generating circuit according to claim 1, wherein said second voltage generating unit is variable.

3. A reference voltage generating circuit comprising:

a differential amplifier having first and second input terminals and one output terminal, for amplifying the voltage difference between two voltages inputted to the input terminals and outputting the amplified voltage from the output terminal;

a ladder resistor unit comprising a plurality of resistors connected in series between the output terminal of said differential amplifier and a ground;

a first voltage generating unit connected to the first input terminal of said differential amplifier, said voltage generating unit applying a first predetermined voltage to said first input terminal wherein said first voltage generating unit for applying said first predetermined voltage to the first input terminal of said differential amplifier is variable; and a switching circuit unit for selectively connecting the second input terminal of said differential amplifier to nodes connecting mutually adjacent resistors among a plurality of resistors comprising said ladder resistor unit.

4. A reference voltage generating circuit comprising:

a differential amplifier having first and second input terminals and one output terminal, for amplifying the voltage difference between two voltages inputted to the input terminals and outputting the amplified voltage from the output terminal;

a ladder resistor unit comprising a plurality of resistors connected in series between the output terminal of said differential amplifier and a ground;

a first voltage generating unit connected to the first input terminal of said differential amplifier, said voltage generating unit applying a first predetermined voltage to said first input terminal; and a switching circuit unit for selectively connecting the second input terminal of said differential amplifier to nodes connecting mutually adjacent resistors among a plurality of resistors comprising said ladder resistor unit, wherein said switching circuit unit selects at least two nodes from said nodes comprising mutually adjacent resistors among a plurality of resistors comprising said ladder resistor unit, and selectively connects the selected units to the second input terminal of said differential amplifier by providing switches to only the selected nodes.

5. A reference voltage generating circuit comprising:

a differential amplifier for amplifying the voltage difference between inputted voltages and for outputting the amplified voltage, the differential amplifier having first and second inputs;

a ladder resistor unit comprising a plurality of resistors connected in series between the output terminal of said differential amplifier and a ground;

a first voltage generating unit connected to the first input of the differential amplifier for applying a predetermined voltage to the first input terminal of said differential amplifier;

a switching circuit unit for selectively connecting the second input terminal of said differential amplifier to nodes connecting mutually adjacent resistors among a plurality of resistors comprising said ladder resistor unit; and a second voltage generating unit connected in series between the ladder resistor unit and the ground.

6. A reference voltage generating circuit according to claim 5, wherein said second voltage generating unit is variable.

7. A reference voltage generating circuit comprising:

a differential amplifier for amplifying the voltage difference between inputted voltages and for outputting the amplified voltage, the differential amplifier having first and second inputs;

a ladder resistor unit comprising a plurality of resistors connected in series between the output terminal of said differential amplifier and a ground;

a first voltage generating unit connected to the first input of the differential amplifier for applying a predetermined voltage to the first input terminal of said differential amplifier; and a switching circuit unit for selectively connecting the second input terminal of said differential amplifier to nodes connecting mutually adjacent resistors among a plurality of resistors comprising said ladder resistor unit, wherein said first voltage generating unit for applying said predetermined voltage to the first input terminal of said differential amplifier is variably controlled.

8. A reference voltage generating circuit comprising:

a differential amplifier for amplifying the voltage difference between inputted voltages and for outputting the amplified voltage, the differential amplifier having first and second inputs;

a ladder resistor unit comprising a plurality of resistors connected in series between the output terminal of said differential amplifier and a ground;

a first voltage generating unit connected to the first input of the differential amplifier for applying a predetermined voltage to the first input terminal of said differential amplifier; and a switching circuit unit for selectively connecting the second input terminal of said differential amplifier to nodes connecting mutually adjacent resistors among a plurality of resistors comprising said ladder resistor unit, wherein said switching circuit unit selects at least two nodes from said nodes comprising mutually adjacent resistors among a plurality of resistors comprising said ladder resistor unit, and selectively connects the selected nodes to the second input terminal of said differential amplifier by providing switches to only the selected nodes.

9. A reference voltage generating method comprising the steps of:

using a differential amplifier to amplify the voltage difference between inputted voltages and to output the amplified voltage from an output terminal of said differential amplifier;

comprising a ladder resistor unit by connecting a plurality of resistors in series between the output terminal of said differential amplifier and an optional fixed electric potential;

applying a predetermined voltage to a first input terminal of said differential amplifier by a voltage generating unit connected to said first input terminal; and selectively connecting nodes comprising mutually adjacent resistors among a plurality of resistors comprising said ladder resistor unit to a second input terminal of said differential amplifier by a switching circuit unit, wherein said ladder resistor unit is connected in series between the output terminal of said differential amplifier and a variable voltage generating unit.

10. A reference voltage generating method comprising the steps of:

using a differential amplifier to amplify the voltage difference between inputted voltages and to output the amplified voltage from an output terminal of said differential amplifier;

comprising a ladder resistor unit by connecting a plurality of resistors in series between the output terminal of said differential amplifier and an optional fixed electric potential;

applying a predetermined voltage to a first input terminal of said differential amplifier by a voltage generating unit connected to said first input terminal; and selectively connecting nodes comprising mutually adjacent resistors among a plurality of resistors comprising said ladder resistor unit to a second input terminal of said differential amplifier by a switching circuit unit, wherein said voltage generating unit for applying said predetermined voltage to the first input terminal of said differential amplifier is variably controlled.

11. A reference voltage generating method comprising the steps of:

using a differential amplifier to amplify the voltage difference between inputted voltages and to output the amplified voltage from an output terminal of said differential amplifier;

comprising a ladder resistor unit by connecting a plurality of resistors in series between the output terminal of said differential amplifier and an optional fixed electric potential;

applying a predetermined voltage to a first input terminal of said differential amplifier by a voltage generating unit connected to said first input terminal; and selectively connecting nodes comprising mutually adjacent resistors among a plurality of resistors comprising said ladder resistor unit to a second input terminal of said differential amplifier by a switching circuit unit, wherein said switching circuit unit selects at least two nodes from said nodes comprising mutually adjacent resistors among a plurality of resistors comprising said ladder resistor unit, and selectively connects the selected nodes to the second input terminal of said differential amplifier by providing switches to only the selected nodes.

12. A method of generating a reference voltage comprising the steps of:

providing a predetermined reference voltage to a first input terminal of a differential amplifier;

providing a first voltage to a second input terminal of the differential amplifier by selectively connecting one of a plurality of nodes of a ladder resistor unit to the second input terminal, wherein the plurality of nodes serially connect a plurality of resistors in the ladder resistor unit;

amplifying the difference between the predetermined reference voltage and the first voltage to generate a reference voltage on an output of the differential amplifier;

providing the reference voltage to a first end of the ladder resistor unit; and providing a second voltage to a second end of the ladder resistor unit.

13. The method of claim 12, wherein the second voltage is variable.

14. A method of generating a reference voltage comprising the steps of:

providing a predetermined reference voltage to a first input terminal of a differential amplifier;

providing a first voltage to a second input terminal of the differential amplifier by selectively connecting one of a plurality of nodes of a ladder resistor unit to the second input terminal, wherein the plurality of nodes serially connect a plurality of resistors in the ladder resistor unit;

amplifying the difference between the predetermined reference voltage and the first voltage to generate a reference voltage on an output of the differential amplifier; and providing the reference voltage to a first end of the ladder resistor unit, wherein the predetermined reference voltage is variable.

* * * * *